US008390299B2

(12) United States Patent
Laepple et al.

(10) Patent No.: US 8,390,299 B2
(45) Date of Patent: Mar. 5, 2013

(54) EARTH GROUND TESTER WITH REMOTE CONTROL

(75) Inventors: Klaus Laepple, Reute (DE); Gavin Kirk, Edmonds, WA (US); Ronald Steuer, Hinterbruhl (AT)

(73) Assignee: Fluke Corporation, Everett, WA (US)

( * ) Notice: Subject to any disclaimer, the term of this patent is extended or adjusted under 35 U.S.C. 154(b) by 35 days.

(21) Appl. No.: 12/625,269

(22) Filed: Nov. 24, 2009

(65) Prior Publication Data

US 2011/0121845 A1 May 26, 2011

(51) Int. Cl.
*G01R 31/28* (2006.01)
*G01R 31/14* (2006.01)

(52) U.S. Cl. ........................ 324/525; 324/509
(58) Field of Classification Search ............ 324/525, 324/509

See application file for complete search history.

(56) References Cited

U.S. PATENT DOCUMENTS

| | | | | | |
|---|---|---|---|---|---|
| 4,209,741 | A | * | 6/1980 | Coby et al. | 324/713 |
| 5,790,038 | A | * | 8/1998 | Scasciafratti | 340/649 |
| 6,396,284 | B1 | * | 5/2002 | Tisdale et al. | 324/525 |
| 7,492,168 | B2 | * | 2/2009 | Ogilvy et al. | 324/683 |
| 7,525,317 | B2 | * | 4/2009 | Yang | 324/509 |
| 2008/0262393 | A1 | * | 10/2008 | Docherty et al. | 601/15 |
| 2011/0121844 | A1 | | 5/2011 | Laepple | |

FOREIGN PATENT DOCUMENTS

| JP | 11002650 | 1/1999 |
|---|---|---|
| KR | 20050001898 | 1/2005 |

OTHER PUBLICATIONS

Brochure, "FLUKE: Earth Ground Resistance—Principles, Testing Methods and Applications," Fluke Corporation, Feb. 5, 2007.
Brochure, "LEM: Electrical Grounding Techniques," LEM Instruments, Nov. 17, 2007.
European Search Report dated May 19, 2010, for EP2325661 published on May 25, 2011 (EPO application corresponding to U.S. Appl. No. 12/952,872, filed Nov. 23, 2010).
Office Action issued by the U.S. Patent and Trademark Office on Oct. 18, 2011 for co-pending U.S. Appl. No. 12/952,872, filed Nov. 23, 2010.
Office Action issued by the U.S. Patent and Trademark Office on May 21, 2012 for co-pending U.S. Appl. No. 12/952,872, filed Nov. 23, 2010.
Amendment dated Apr. 16, 2012 in response to the Office Action issued by the U.S. Patent and Trademark Office on Oct. 18, 2011 for co-pending U.S. Appl. No. 12/952,872, filed Nov. 23, 2010.
Users Manual, "Operation Instructions—Earth Ground Tester, Saturn Geo X," Lem Norma GmbH, May 9, 2006.

* cited by examiner

*Primary Examiner* — Amy He
(74) *Attorney, Agent, or Firm* — Nelson, Mullins, Riley & Scarborough LLP

(57) ABSTRACT

A testing device which may be used to conduct ground resistance and soil resistivity measurements. The testing device comprises both a main unit and a remote unit adapted to communicate with one another via a communication link. After setting the testing device up according to the desired measurement technique, the procedure may be carried out, and the resulting measurement values are subsequently displayed on the remote unit. This allows a single operator to perform measurements while standing directly adjacent to an electrode, which is, for example, placed at a large distance from the main unit and/or other electrodes. This relieves the operator from constantly having to walk back and forth placing electrodes in different positions, and also obviates the need to return to the main unit of the testing device to consult a display and/or change parameters or settings.

24 Claims, 8 Drawing Sheets

EARTH GROUND TESTER WITH REMOTE CONTROL

FIELD OF THE INVENTION

The present invention relates generally to a facilitated method and apparatus for performing multiple ground resistance and soil resistivity measurements.

BACKGROUND OF THE INVENTION

A lack of good grounding is undesirable and increases the risk of equipment failure. The absence of an effective grounding system can lead to various problems, such as instrumentation errors, harmonic distortion issues, power factor problems and a host of possible intermittent dilemmas. If fault currents have no path to the ground through a properly designed and maintained grounding system, they will find unintended paths. Furthermore, a good grounding system is also used to prevent damage to industrial plants and equipment and is therefore necessary in order to improve the reliability of equipment and reduce the likelihood of damage due to lightning or fault currents.

Over time, corrosive soils with high moisture content, high salt content, and high temperatures can degrade ground rods and their connections. So although the grounding system may have had low earth ground resistance values when initially installed, the resistance of the grounding system can increase if the ground rods, or other elements of a grounding system, corrode over time. Grounding testers are useful troubleshooting tools in dealing with such issues as intermittent electrical problems, which could be related to poor grounding or poor power quality. It is therefore desirable that all grounds and ground connections are checked on a regular basis.

During these periodic checks, if an increase in resistance of more than 20% is measured, investigation of the source of the problem is undertaken so that corrections may be made to lower the resistance (e.g., by replacing or adding ground rods to the ground system). Such periodic checks may involve conducting established techniques such as fall-of-potential tests, selective measurements, soil resistivity tests which may also form part of a geological survey, two-pole measurements and stakeless measurements. With present grounding test systems, in order to achieve accurate results, such tests tend to be extremely time consuming and labor intensive. In particular when dealing with measurements involving high voltage applications such as electricity pylons, the tests need to be conducted with caution.

According to the prior art, all the aforementioned grounding test procedures require a considerable amount of effort walking back and forth several times between the various electrodes connected to a testing device to ensure accuracy and/or perform multiple measurements. Specifically, once a testing device has been set up for implementing the aforementioned techniques according to the prior art, incorrect or anomalous results can occur due to inadequate contact between the electrodes and test device due to loose clips, insufficient conduction or unsuitable placement of the electrodes. Hence, it is generally necessary to adjust the set-up and repeat measurements in order to correct such results. For example, an operator may check all connections at the various electrodes, which are often placed at large distances from one another.

Performing this repeat measurement/correction procedure with a single operator tends to be extremely time-consuming and labor-intensive. In order to reduce the wasted time and effort associated with this procedure, a common solution to this problem is to provide more than one operator to conduct a single test procedure; however this is often not realistic or possible due to the availability of such further personnel. Furthermore, this solution is neither efficient nor convenient and incurs considerable extra costs.

SUMMARY OF THE INVENTION

The present invention recognizes and addresses the foregoing considerations, and others, of the prior art.

According to one aspect, the present invention provides a testing device which may be used to conduct any of the aforementioned techniques. The testing device comprises both a main unit and a remote unit adapted to communicate with one another via a communication link. After setting the testing device up according to the desired measurement technique, the respective procedure may be carried out, and the resulting measurement values are subsequently displayed on the remote unit. This allows a single operator to perform measurements while standing directly adjacent to an electrode, which is, for example, placed at a large distance from the main unit and/or other electrodes. This relieves the operator from constantly having to walk back and forth placing electrodes in different positions, and also obviates the need to return to the main unit of the testing device to consult a display and/or change parameters or settings.

With respect to fall-of-potential measurements, selective measurements and two-pole measurements, in order to achieve appropriate levels of accuracy when performing earth ground measurements, it is desirable that the respective resistances of the auxiliary electrodes are not too high compared to the resistance of the earth ground rod being tested. In geologically difficult conditions wherein high contact resistances between the electrode and the earth exist, exemplary embodiments enable the operator to observe this resistance displayed on the remote unit and take appropriate countermeasures should the value be too high. Such countermeasures may include tamping down the soil around the electrode or pouring water around the electrodes in order to improve contact at the soil/electrode interface. Thereafter, the operator can easily repeat the measurements in order to assess the success of the implemented countermeasures, without having to move location. Hence, this embodiment advantageously increases the efficiency of performing such measurements by eliminating a considerable amount of time and effort, which would normally be expended by at least one operator (and possibly several) walking back and forth between all three of the electrodes.

According to exemplary embodiments, the remote unit of the testing device preferably includes a display to indicate the measurement result in addition to a control means for performing different tests and measurements. Said control means may for example be used to set parameters, to start the test and to store the result, etc. The remote unit of the testing device may then transmit the respective commands to the main unit, which generates a predetermined current between the respective electrodes and performs the relevant measurements. Upon completing the measurement, the main unit may transmit the measurement result to the remote unit of the testing device.

In one embodiment, the communication (i.e., transmission of commands, parameters and results) may be performed using a cable communication link between the main and remote unit. For example, embodiments are contemplated in which existing electrode test leads connected to the main unit may be utilized in order to communicate to and from the remote unit.

In a preferred embodiment of the present invention, however, such communication between the main and remote units of the testing device occurs wirelessly. This obviates the need for cumbersome wires, thus saving expense and reducing the steps required in setting up the testing device for use. Such wireless communication preferably occurs via a radio frequency (RF) link. For example, Bluetooth, ZigBee, WLAN, mobile phone frequencies or other suitable RF link may be used for this purpose. In an alternative embodiment, the wireless communication may occur by infrared technology.

In a further embodiment, the main unit of the testing device may comprise its own display in addition to control means so that it may operate without the remote unit. This embodiment advantageously provides a back up system, should the remote unit become inoperable. However, in another embodiment of the present invention, the main unit could also merely comprise a "black box," which effectively requires the remote unit to operate it. A testing device according to this embodiment requires less components and thus achieves a reduction in manufacturing costs.

In yet another embodiment, the remote unit preferably comprises a handheld and portable device, which may be removably coupled with the main unit mechanically and/or electrically. FIG. 6 shows an example of such a remote unit according to this embodiment of the present invention, wherein the main unit acts as a dock for the remote unit. This embodiment allows convenient transportation of the testing device between measurement sites.

In yet a further embodiment of the present invention, the testing device, preferably the remote unit thereof, may be equipped with a GPS receiver, which enables position and distance information to be captured and used for further analysis. The GPS receiver may also be used to obtain absolute coordinates including geographical location and distance information in three dimensions (i.e., including altitude). Thus, the GPS receiver may enable the literal mapping and location of the tests conducted and the respective distances involved (e.g., the respective locations of the remote probes during soil resistivity measurements). According to another embodiment, these coordinates may be stored in a database of sites that have been tested, wherein said data could be used for reporting, logging and preventative maintenance purposes. This is especially advantageous when applied to, for example, earth ground testing or geological surveys, since it is often necessary to measure a particular resistance, which is related to a respective distance. Furthermore, the inclusion of such a GPS receiver may also improve and facilitate the gathering of data for the purposes of obtaining a more accurate, or complete fall-of-potential curve, or geological surveys.

In an alternative embodiment, light (e.g., laser) or ultrasonic distance measurement means may be integrated in preferably the remote unit of the testing device in order to facilitate the determination of distance data. By incorporating such distance measurement means, the need to perform time-consuming and potentially inaccurate manual measurements is advantageously obviated.

In a further embodiment, either or both of the main and remote units may comprise memory storage and processing circuitry for storage and processing of all determined and measured values including, for example, distances, GPS coordinates, date and time, as well as standard test parameters. This offers the advantage that a full record of all measurements taken over a given time period or of a particular grounding system or area may be obtained which may, for example, be used for facilitated data comparison after the final measurement has been made.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
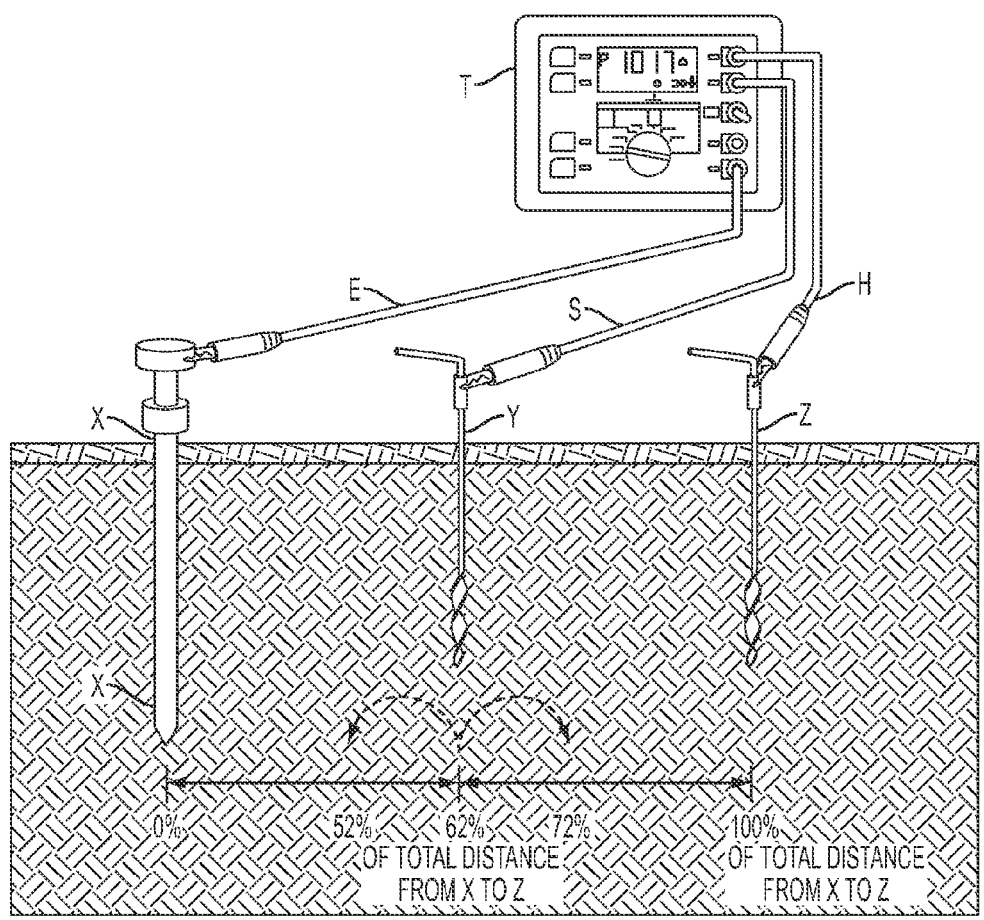
FIG. 1 shows a testing device for conducting a 3-pole fall-of-potential test according to the 62% rule according to one embodiment of the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

Fall-of Potential Measurement

As described above, one known method of measuring the ability of an earth ground system or an individual electrode to dissipate energy from a site is the so-called "fall-of-potential" test.

In one example of this test implemented according to the present invention, an earth electrode or ground rod to be tested is disconnected from its connection to the grounding system to avoid obtaining incorrect (i.e., too low) earth resistance measurements caused by parallel grounding. The main unit of the testing device is then connected to the earth electrode X, which may then be used as a first current electrode X. One technique of performing a fall-of-potential test is three-point or 3-pole testing, as illustrated in FIG. 1. For the 3-pole fall-of-potential test, two further (auxiliary) electrodes Y and Z are provided (generally in the form of respective earth stakes), wherein one of the electrodes Z is placed in the soil at a predetermined distance away from the earth electrode X in order to be used as a second current electrode Z. The other auxiliary electrode Y is subsequently placed in the soil, for example, along a direct line between the earth electrode X and current electrode Z in order to be used as a voltage probe Y. Another common measurement topology (not shown) comprises placing the electrodes at a different angle to one another (e.g., 90 degrees). The two auxiliary electrodes Y and Z are also connected to the testing device.

In a next step according to this example, the main unit MU of the testing device T can generate a predetermined (known) current between the current electrode Z and the earth electrode X. The drop in voltage potential along this current path can then be measured at predetermined points along this direct line between the current electrode Z and the earth electrode X by means of the probe Y (e.g., a value for the potential drop between the earth electrode X and the probe Y may be obtained). Using Ohm's Law (V=IR), the main unit MU of the testing device T is then able to automatically calculate the resistance of the earth electrode X based on the known current generated and the measured drop in potential, and display this information on the remote unit REM. If the earth electrode X is in parallel or series with other ground rods (not shown), the resistance value derived comprises the total resistance value of all ground rods.

In order to achieve the highest degree of accuracy when performing a 3-pole ground resistance test, the auxiliary current electrode Z should be placed outside the sphere of influence of the earth electrode X being tested and the inner probe Y. If the auxiliary current electrode Z is not placed outside the sphere of influence, the effective areas of resistance will overlap and invalidate any measurements made by the testing device. Also, in general, the Z electrode should extend below the surface at a distance greater than that of the depth of the earth ground rod being tested. The following table provides examples for the appropriate setting of the auxiliary electrodes Y and Z.

| Depth of Earth Electrode X (meters) | Distance to Probe Y (meters) | Distance to Current Electrode Z (meters) |
|---|---|---|
| 2 | 15 | 25 |
| 3 | 20 | 30 |
| 6 | 25 | 40 |
| 10 | 30 | 50 |

In order to test the accuracy of the results and to ensure that the auxiliary electrodes Y and Z are outside the spheres of influence, the probe Y may be, for example, repositioned in accordance with the so-called 62% rule. This rule applies only when the earth electrode X, potential probe Y and current electrode Z are in a straight line and properly spaced (for most purposes the current electrode Z should be 30 meters to 50 meters from the ground electrode X under test), when the soil is homogeneous and when the ground electrode X has a small resistance area. Bearing these limitations in mind, this method can ideally be used on small ground electrode systems consisting of a single rod or plate etc. and on medium systems with several rods.

Since the 62%-rule is valid for ideal environment conditions with consistent geological conditions, as outlined above, it is normally necessary in practice for the operator to verify the test result measured at 62% of the distance between X and Z, by repeating the test with the Y electrode at 52% and 72% of the distance between the X and Z electrodes (i.e., repositioning Y at 10% of the distance between X and Z, in either direction). If all three results are similar, then the original result obtained at the 62% distance may be considered to be correct. However, should the three results significantly change (e.g., 30% difference), it is necessary for the distance of the Z electrode from the ground rod X being tested to be increased, before subsequently repeating the whole test procedure. In other words, it is normally necessary to take multiple readings at varying distance placements for the current electrode Z in order to confirm and verify results. Also, with such 3-pole testing, the main unit MU of the testing device T is often required to be located at the ground rod X to be tested since it is generally necessary to connect the device with the earth electrode via a short lead or conductor. The short lead ensures that its effect is negligible with respect to the leads connecting the Y and Z electrodes.

Hence, by displaying measurement results on a remote unit REM, a method and apparatus in accordance with the present invention advantageously enables a simplified manner of conducting multiple measurements while reducing a considerable amount of effort which would normally expended on walking back and forth several times between both of the Y and Z electrodes and the main unit MU of the testing device T.

Selective Measurement

Figure 2A:
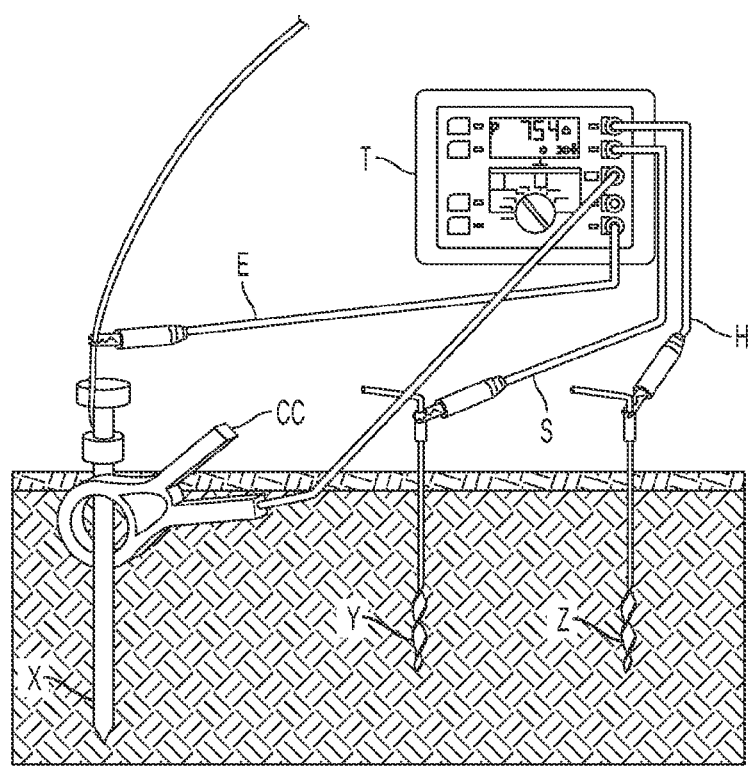
FIG. 2a shows a testing device for performing selective measurements.

According to another example of the present invention shown in FIG. 2a, selective measurement may be implemented. This technique is very similar to the "fall-of-potential" testing described above in that implementation thereof provides the same measurements as those resulting from the fall-of-potential technique. Applying this technique, however, it is not necessary to disconnect the earth electrode to be tested from its connection to the grounding system (which could alter the voltage potentials of the entire earthing system, thus potentially giving cause to incorrect and therefore misleading measurement results). Thus, an operator conducting the measurements is no longer required to disconnect the earth ground, which should be done with caution. This also reduces risk to other personnel or electrical equipment which may be found within a non-grounded structure.

Figure 2B:
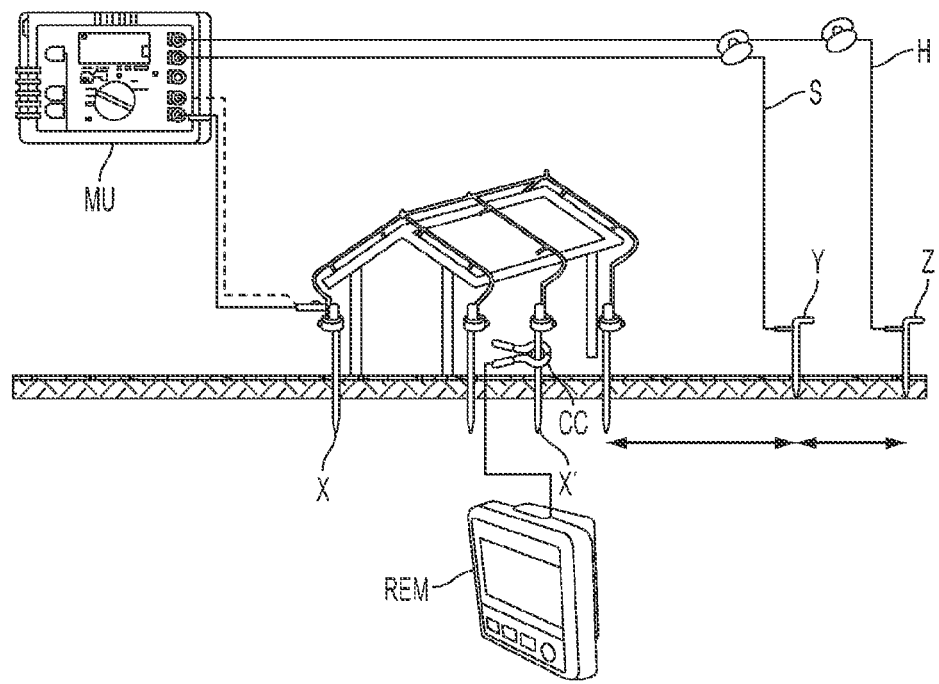
FIG. 2b shows a testing device for performing selective measurements on a plurality of ground rods according to an embodiment of the present invention.

Similar to the previous embodiment, the two auxiliary electrodes (i.e., current electrode Z and probe Y), can be placed in the soil, for example in a direct line, at predetermined distances away from the earth electrode X being tested as shown in FIGS. 2a and 2b. As previously described, another common measurement topology (not shown) comprises placing the electrodes Y and Z at a different angle to one another (i.e., 90 degrees). The main unit MU of the testing means T is then connected to the earth electrode X, with the advantage that the connection to the site does not need to be disconnected, as would normally be necessary. According to the example of a preferred embodiment shown in FIG. 2b, a current clamp CC is connected to the remote unit REM of the testing device and may be placed around the earth electrode X to be tested in order to ensure that only the resistance of that earth electrode X is measured.

For selective measurements, the use of such a current clamp CC then allows the measurement of the exact resistance of an individual earth ground rod (e.g., each ground rod of a building or, for instance, a high voltage pylori footing). As with the previous embodiment, a known current is generated by the main unit MU of the testing device T between the current electrode Z and the earth electrode X. The drop in voltage potential is then measured between the probe Y and the earth electrode X. However, the current flowing through the earth electrode X of interest is then measured by means of a current clamp CC. As outlined above, generated current will also flow through other parallel resistances, but the current measured by means of the clamp CC is used to calculate a resistance value for the earth electrode X of interest according to Ohm's Law (V=IR). In other words, the current clamp CC eliminates the effects of parallel resistances in a grounded system.

In an example of the embodiment shown in FIG. 2b, the total resistance of a particular ground system comprising a plurality of connected earth electrodes or ground rods may be measured. According to this embodiment, the earth electrode resistance is measured by placing the clamp around each individual earth electrode (e.g., X and X') in turn. The total resistance of the entire ground system can then subsequently be determined by calculation.

By using such a current clamp CC connected to the remote unit REM of the testing device according to this embodiment, the operator is advantageously able to walk freely around (e.g., a building or earth ground system to be measured) and measure the resistance of every individual earth ground rod, while obviating the necessity to reconfigure the wiring of the whole test configuration at every individual test point.

For this application, the use of a wireless communication link to transmit and/or receive information between the main MU and remote units REM is preferred.

Soil Resistivity/Geological Survey

Figure 3A:
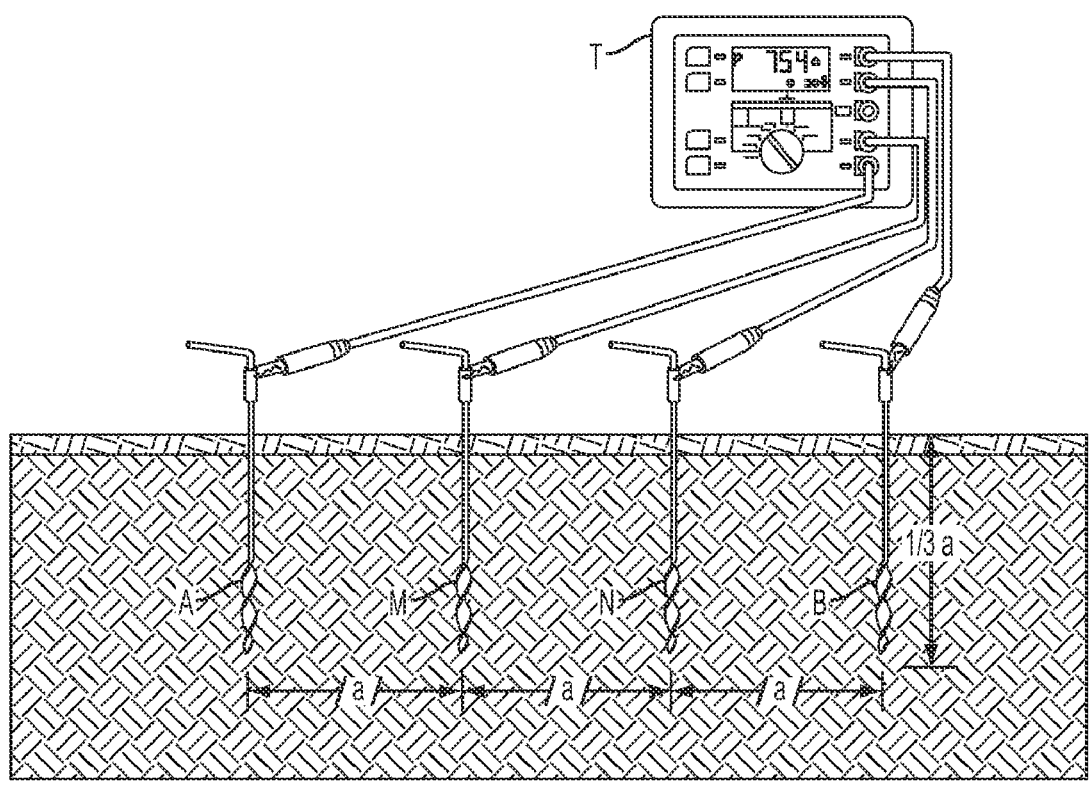
FIG. 3a shows a testing device for measuring soil resistivity with 4-pole tests.
Figure 3B:
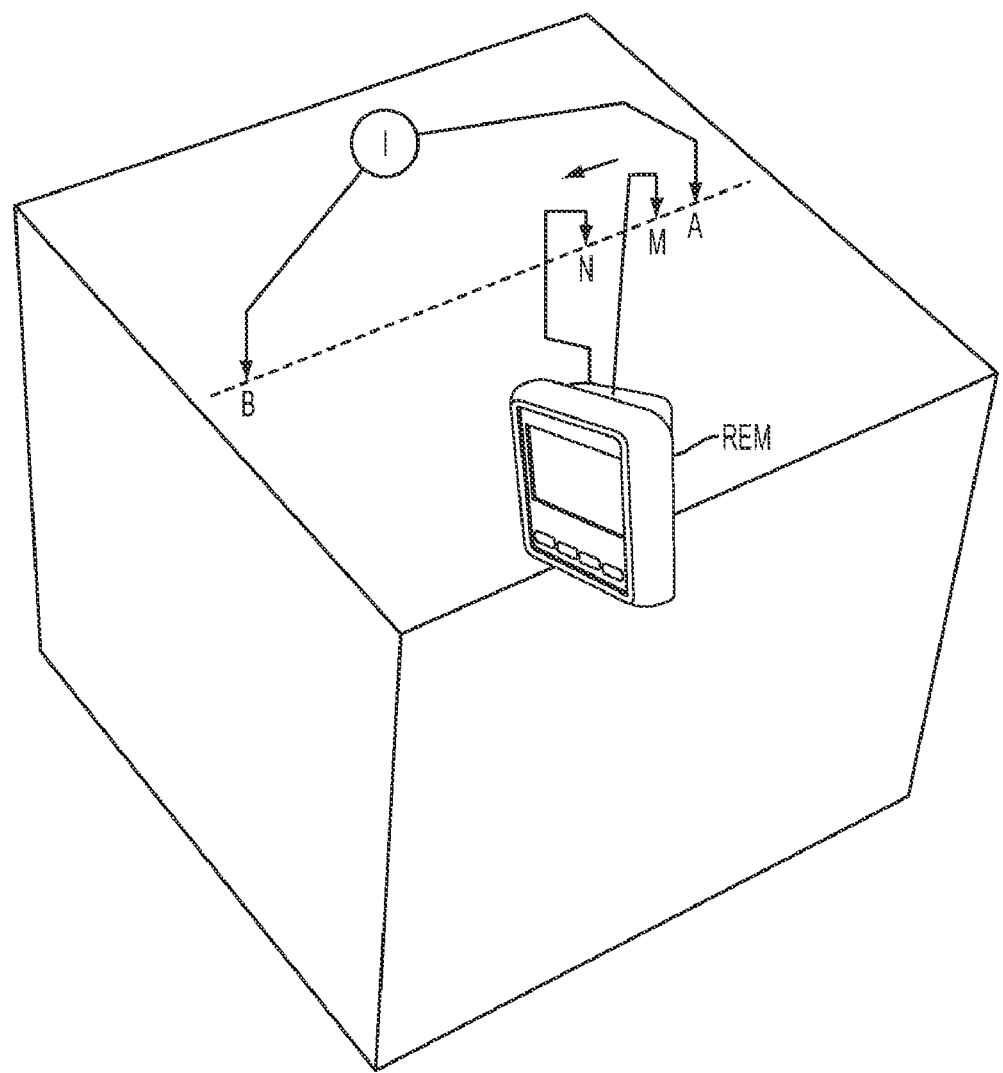
FIG. 3b shows a testing device for conducting a geological survey using 4-pole tests according to yet another embodiment of the present invention.

In yet another example of an implementation of the present invention, a geological survey may be performed using standard soil resistivity measurements achieved by means of a so-called four-point or 4-pole test, as illustrated in FIGS. 3a and 3b. This technique involves the use of four electrodes A, B, M and N placed into the soil, wherein two (outer) electrodes A and B are used to generate a current and the two inner electrodes M and N may, in one embodiment, be placed directly along the current path and act as voltage potential probes to measure the drop across the soil being tested. Another alternative arrangement, as discussed beforehand, comprises placing the electrodes at different angles to one another (i.e., staggered). The soil resistivity measurement technique contrasts to the 3-pole tests of the aforementioned embodiments wherein one of the current electrodes and potential probes are effectively combined in the (short) lead connecting the main unit MU of the testing means to the earth electrode X. In particular, in this embodiment, since the distance of the measurement electrodes M and N relate to the depth of the investigated soil layer, it is desirable for the area under investigation to be scanned with measurement probes M and N in an equidistant manner.

In the example shown in FIGS. 3a and 3b, four earth ground electrodes (two outer current electrodes A and B and two inner voltage probes M and N) are positioned in the soil in a straight line, equidistant from one another. The distance between respective electrodes A, B, M and N should ideally be at least three times greater than the depth of the electrodes below the surface. For example, if the depth of each ground electrode is 30 meters, the distance between electrodes A, B, M and N should be greater than 91 meters. According to the example in FIG. 3b, in order to calculate the soil resistance, the main unit MU of the testing device to which the two outer ground electrodes A and B are connected, generates a known current between the electrodes A and B and the drop in voltage potential is subsequently measured by means of the two inner probes M and N. Using Ohm's Law (V=IR), the testing device is then able to automatically calculate the soil resistance based on these measurements and may display these values on the remote unit REM.

In a preferred embodiment of the present invention as shown in the example in FIG. 3b, electrodes A and B are connected to the main unit MU of the testing device T, while the electrodes M and N are connected to the remote unit REM of the testing device T. Specifically, the main unit MU of the testing device T is responsible for generating the known current, while the remote unit REM connected to electrodes M and N is used to measure the fall of potential therebetween. Thus, by virtue of the portability of the remote unit REM, the location of said voltage potential measuring electrodes M and N may, for example, be moved towards the B electrode and multiple measurements be performed, without the need for readjustment of the main unit MU of the testing device T, or the electrodes A and B. Thus, this preferred embodiment of the present invention permits the current electrodes A and B to advantageously remain at a single location, while enabling multiple measurements to be performed with probes M and N, and subsequently displayed on the remote unit REM. This is possible since the necessary spacing between the probes M and N is typically a few meters. By assembling the probes M and N and the remote unit REM together, this provides a convenient means to gather the desired measurement results for soil resistivity (such as for a geological survey), while obviating the necessity to move long leads connected to the current (A and B) electrodes.

It should be noted that measurement results may often be distorted and invalidated by underground pieces of metal, underground aquifers, areas of nonhomogeneous soil, varying depths of bedrock, etc. It may therefore be preferable to perform additional measurements wherein the axes of the electrodes are turned 90 degrees. By changing the depth and distance of the electrodes A and B and probes M and N several times while performing a measurement, it is possible to produce a highly accurate profile which may be used in order to determine an appropriate ground resistance system for a particular area. The aforementioned embodiment of the present invention additionally facilitates performing such additional measurements, in particular due to the convenience of the operator not having to consult the main unit MU of the testing device T upon every adjustment and/or performing each new measurement test procedure.

Two-Pole Measurement

Figure 4:
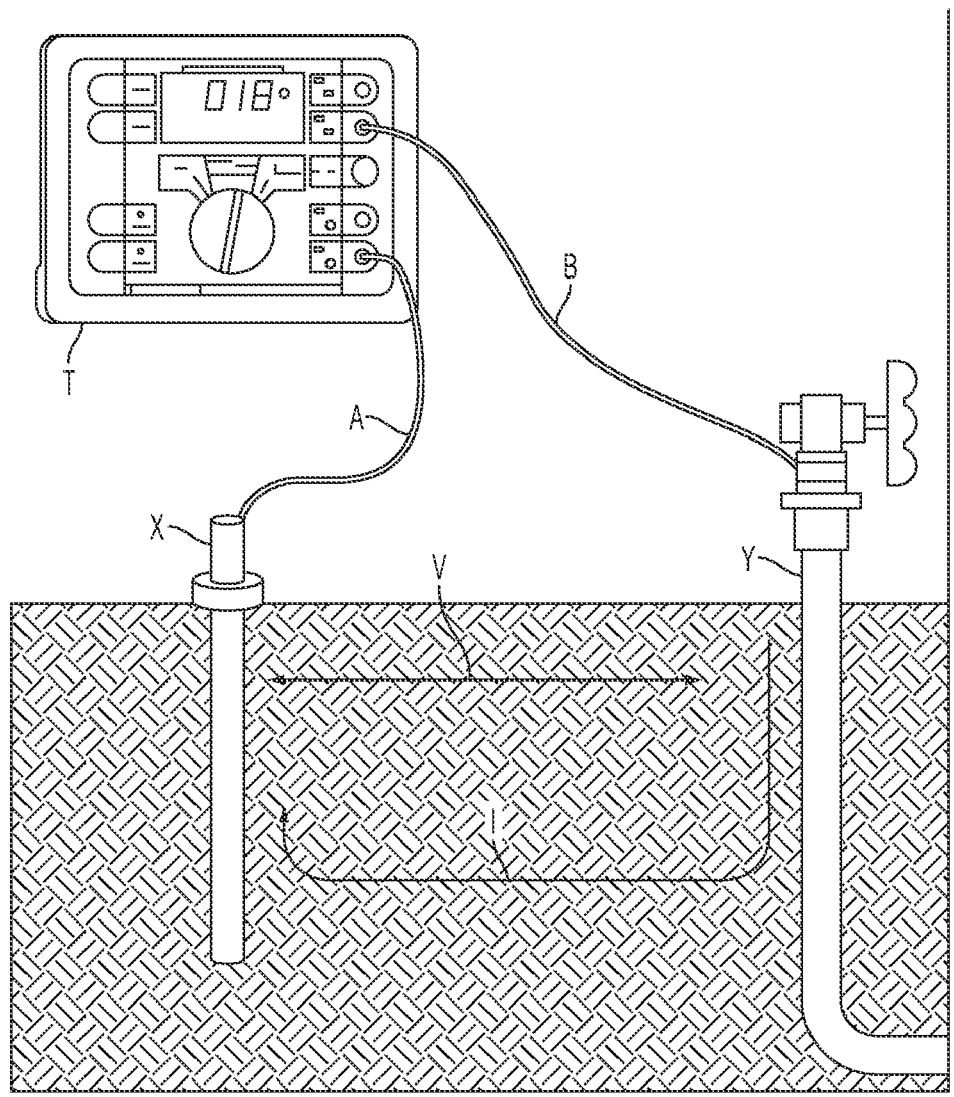
FIG. 4 shows a method for performing two-pole measurements according to the present invention.

Yet a further technique which may be implemented in accordance with the present invention involves a single auxiliary electrode Y placed in the ground. For this technique to function correctly, it is necessary for the auxiliary electrode Y to be outside the influence of the electrode X under test. However, the convenience of this technique is that fewer connections are required since the auxiliary electrode Y may constitute any suitable conductor placed in the ground in the vicinity of the ground electrode to be tested, such as a water pipe as shown in FIG. 4. The testing device measures the combined earth resistance of the electrode under test, the earth resistance of the auxiliary electrode Y, and the resistance of the measurement leads which connect the electrodes X and Y with the testing means. The assumption is that the earth resistance of the auxiliary electrode Y is very low, which, in the case of a water pipe, would probably be true for metal pipe without plastic segments or insulated joints. Furthermore, in order to achieve a more accurate result, the effect of the measurement leads A and B may be eliminated by measuring a resistance value with the leads A and B shorted together (i.e., connected to one another), and subtracting this reading from the final measurement.

According to one example, as illustrated in FIG. 4, the main unit MU of the testing device T is connected to the ground electrode to be tested by means of a first measurement lead A and the auxiliary electrode Y is connected to the main unit MU by means of a second measurement lead B, similar to the aforementioned fall-of-potential and selective resistivity tests. A current is generated between the two electrodes X and Y by the main unit MU, which subsequently performs the relevant measurements, and the results are then displayed on the remote unit REM (not shown). By performing a measurement according to this method, the operator may ascertain whether the reading is accurate. For instance, if an anomalous reading is displayed, the operator is able to immediately search for the root cause at the auxiliary electrode Y (for example, a loose contact, loose crocodile clip, etc.) without the need for walking back and forth between the two electrodes X and Y. After adjusting the connection to the auxiliary electrode Y, the operator may immediately repeat the measurement and thereby receive immediate feedback regarding the effect of the corrective action. In other words, the aforementioned embodiment of the present invention additionally facilitates performing measurements, in particular due to the convenience of the operator not having to consult the main unit of the testing device upon every adjustment and/or every new measurement test procedure.

Stakeless Measurement

Figure 5A:
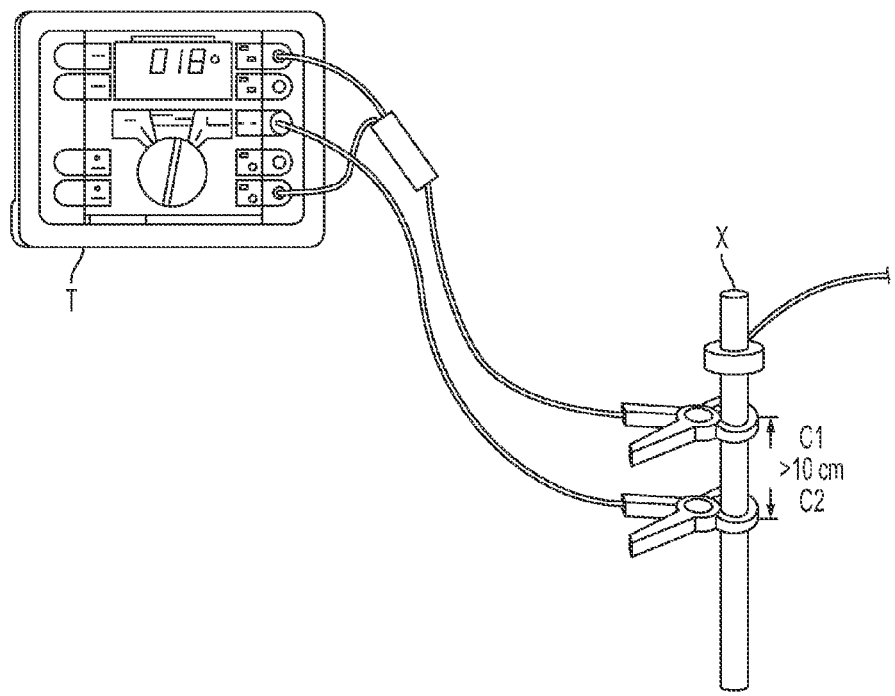
FIG. 5a shows a testing device connected to a grounding electrode to be measured via two clamps, for performing stakeless measurements of a ground electrode according to the present invention.
Figure 5B:
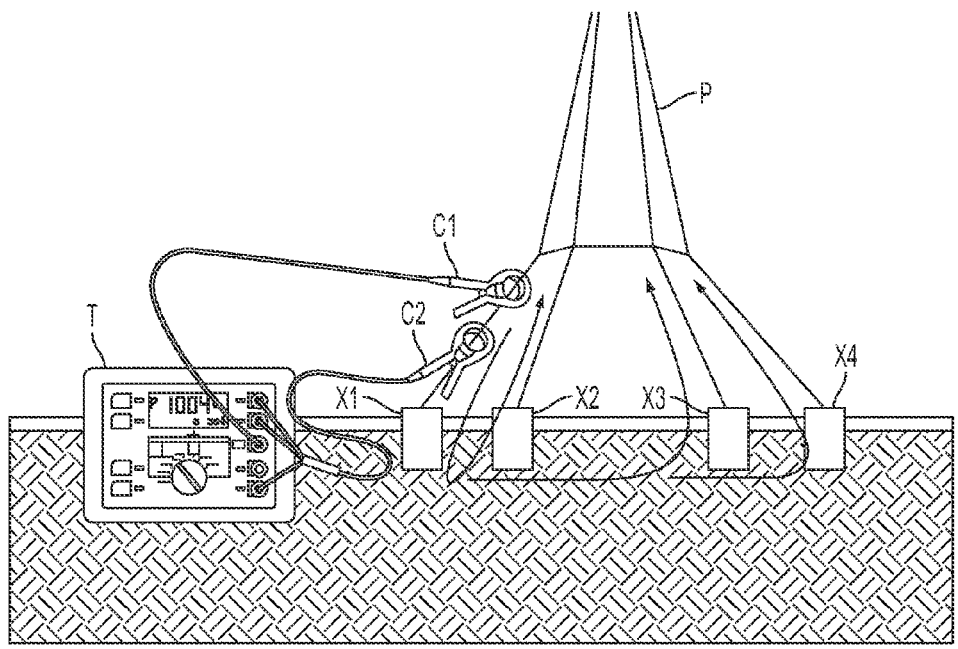
FIG. 5b shows a testing device for performing stakeless measurements of a ground electrode according to the present invention.
Figure 5C:
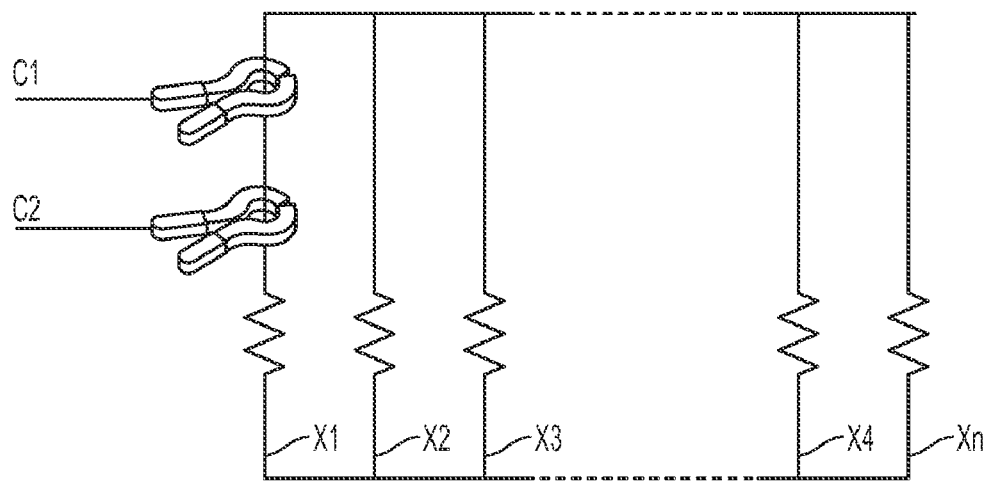
FIG. 5c is an equivalent circuit diagram showing the parallel resistances of a grounding system upon which stakeless measurements are performed according to the present invention.

In contrast to the above techniques, a further technique according to the present invention, illustrated in FIGS. 5a to 5d, enables the testing device T to measure earth ground loop resistances in a grounding system using for example, current clamps C1 and C2, as opposed to auxiliary electrodes in the form of stakes. As illustrated in FIG. 5b, a loop according to this technique may include further elements of the grounding system other than the ground electrode X under test. Such further elements may include the ground electrode conductor, the main bonding jumper, the service neutral, utility neutral-to-ground bond, utility ground conductors (between poles) and utility pole grounds.

This technique also offers the advantage of eliminating the risky and time-consuming activity of disconnecting parallel-connected grounds and furthermore eliminates the need of having to go through the arduous process of finding suitable locations for the auxiliary electrodes. This technique also enables earth ground tests to be conducted where access to soil carries risk, is dangerous, difficult or simply not possible, due to obstacles, geology or absence of soil in the vicinity.

In this technique the testing device is connected to at least one voltage generation (current inducing) means C1 and at least one current measurement (current sensing) means C2, preferably in the form of respective current inducing C1 and current transforming clamps C2. These two clamps C1 and C2 are placed around the earth ground rod X or element of the grounding system to be measured, and the inducing clamp C1 then generates a predetermined (i.e., known) voltage in said ground rod X. The resulting current flowing in the ground rod X can be measured using the sensing clamp C2, which is preferably placed around the ground rod (or like) between the inducing clamp C1 and the soil, in order to measure the current flowing downward from the ground rod into the earth. A resistance value for the ground loop may then be calculated based on these known values of induced voltage and measured resulting current, which may then be displayed on the remote unit.

Figure 5D:
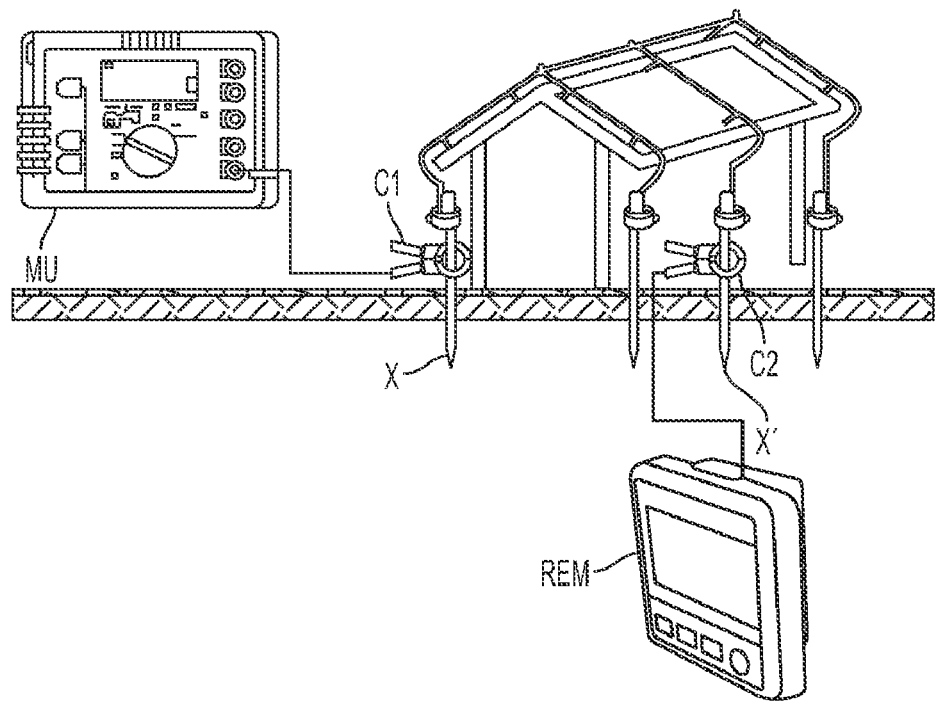
FIG. 5d shows a testing device for performing stakeless measurements on a plurality of ground rods according to an embodiment of the present invention.
Figure 6:
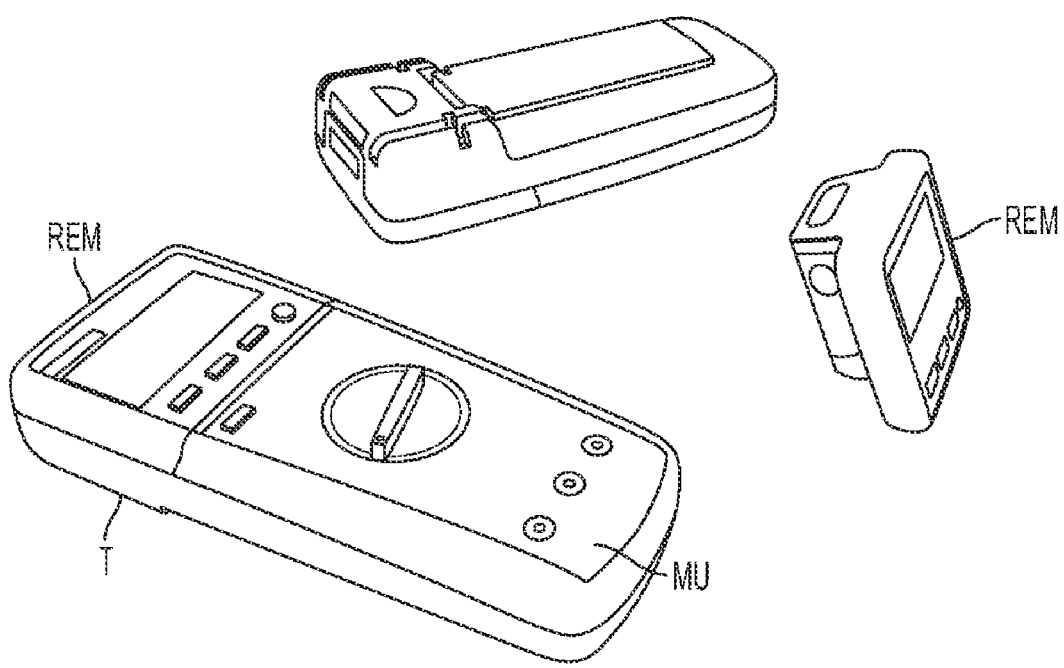
FIG. 6 shows a testing device for performing measurements comprising a coupleable main unit and remote unit according to the present invention.

An example of how this stakeless measurement technique may be applied according to the present invention is shown in FIG. 5d. In particular, FIG. 5d shows a lightning protection system that may be implemented in a large building with a plurality of earth ground rods, wherein each of these rods must be tested individually. According to known testing systems, for each measurement taken, both of the two clamps C1 and C2 necessary for stakeless measurement must be clamped to each earth ground rod due to the short leads connecting the clamps to the testing device. Since the clamps are not always easy to attach, the measurement procedure for the entire system may involve a great deal of time and effort to complete. Therefore, the present invention contemplates that the current inducing clamp C1 is connected once, for the entire measurement procedure, to one of the earth ground rods X of the lightning protection system. The current sensing clamp C2 may then be connected to the remote unit REM and thereby be made portable. Since all the earth rods of the system are connected, this configuration enables the operator to be able to walk around the building and perform measurement tests on each individual earth ground rod (such as rod X') by simply applying a single (current sensing) clamp C2 to each ground rod to be tested. This obviates the need for the operator to carry the inducing clamp C1 and subsequently attach it to each individual ground rod. This advantageously reduces the number of steps necessary for each test, and increases the efficiency and convenience of the whole test procedure.

In addition to the above, the skilled person will understand that some of the aforementioned measuring techniques may be conducted as AC or DC measurements, and any other suitable techniques required for a specific purpose, such as Kelvin DC measurements, may also be implemented in accordance with the present invention.

While preferred embodiments of the invention have been shown and described, modifications and variations may be made thereto without departing from the spirit and scope of the present invention. In addition, it should be understood that aspects of various embodiments may be interchanged both in whole or in part. Furthermore, those of ordinary skill in the art will appreciate that the foregoing description by way of example only and is not intended to be limitative of the invention further described in the appended claims.

What is claimed is:

1. A method of measuring earth ground resistivity at a test site comprising steps of:
    providing a testing device including a main unit and a portable remote unit adapted to communicate with one another at the test site;
    connecting said main unit of said testing device to at least two electrodes;
    generating a predetermined current between said two electrodes;
    measuring a drop in voltage potential between said electrodes;
    calculating resistance values based on said predetermined current and measured drop in voltage potential values; and
    displaying any of said values on said remote unit for viewing by a user at the test site,
    wherein said two electrodes are placed in soil at a predetermined distance from one another and the voltage drop is measured by placing at least one probe connected to the remote unit in the soil along the current path.

2. The method of claim 1 wherein said remote unit communicates with said main unit via a wireless communication link.

3. The method of claim 2 wherein said wireless communication link comprises an RF link selected from the group of ZigBee, Bluetooth or wireless LAN, or mobile phone frequencies.

4. The method of claim 2 wherein said wireless communication link comprises an infrared link.

5. The method of claim 1 wherein at least one of said main unit and remote unit comprises distance measurement means comprising at least one of a GPS receiver, a laser, an ultrasonic device, a mechanical device for obtaining distance information wherein said distance information includes at least one of geographical location and 3D coordinates of each measurement.

6. The method of claim 1 wherein at least one of said main unit and remote unit comprises control operation means and is adapted to perform the step of calculation.

7. A method of measuring earth ground resistivity at a test site comprising steps of:
providing a testing device including a main unit and a portable remote unit adapted to communicate with one another at the test site;
connecting said main unit of said testing device to at least two electrodes;
generating a predetermined current between said two electrodes;
measuring a drop in voltage potential between said electrodes;
calculating resistance values based on said predetermined current and measured drop in voltage potential values; and
displaying any of said values on said remote unit for viewing by a user at the test site,
wherein said testing device includes a current clamp connected to the remote unit and further comprises the step of placing the clamp around one of the electrodes and measuring the current through the electrode, in order to enable calculation of a value for the resistance of said electrode.

8. The method of claim 7 wherein said remote unit communicates with said main unit via a wireless communication link.

9. The method of claim 8 wherein said wireless communication link comprises an RF link selected from the group of ZigBee, Bluetooth or wireless LAN, or mobile phone frequencies.

10. The method of claim 8 wherein said wireless communication link comprises an infrared link.

11. The method of claim 7 wherein at least one of said main unit and remote unit comprises distance measurement means comprising at least one of a GPS receiver, a laser, an ultrasonic device, a mechanical device for obtaining distance information wherein said distance information includes at least one of geographical location and 3D coordinates of each measurement.

12. The method of claim 7 wherein at least one of said main unit and remote unit comprises control operation means and is adapted to perform the step of calculation.

13. An apparatus for measuring earth ground resistivity at a test site comprising:
a testing device, wherein said testing device includes:
a main unit; and
a portable remote unit
wherein said main unit and said remote unit are separable from one another but adapted to communicate with one another at the test site; and
said main unit of said testing device is connected to at least two electrodes; and
wherein said testing device is adapted to:
generate a predetermined current between said two electrodes which are placed in soil at a predetermined distance from each other;
measure a drop in voltage potential between said electrodes by placing at least one probe connected to the remote unit in the soil along the current path;
calculate resistance values based on said predetermined current and measured drop in voltage potential values; and
display any of said values on said remote unit at the test site.

14. The apparatus of claim 13 wherein said remote unit is adapted to communicate with said main unit by means of a wireless communication link.

15. The apparatus of claim 14 wherein the wireless communication link is an RF link selected from the group of ZigBee, Bluetooth or wireless LAN or mobile phone frequencies.

16. The apparatus of claim 14 wherein the wireless communication link is an infrared link.

17. The apparatus of claim 13 wherein at least one of said main unit and remote unit comprises distance measurement means preferably comprising at least one of a GPS receiver, a laser, an ultrasonic device, a mechanical device for obtaining distance information, wherein said distance information preferably includes at least one of geographical location and 3D coordinates of each measurement.

18. The apparatus of claim 13 wherein at least one of said main unit and remote unit comprises control operation means and is adapted to perform the step of calculation.

19. An apparatus for measuring earth ground resistivity at a test site comprising:
a testing device, wherein said testing device including:
a main unit; and
a portable remote unit
wherein said main unit and said remote unit are separable from one another but adapted to communicate with one another at the test site; and
said main unit of said testing device is connected to at least two electrodes; and
wherein said testing device is adapted to:
generate a predetermined current between said two electrodes;
measure a drop in voltage potential between said electrodes;
calculate resistance values based on said predetermined current and measured drop in voltage potential values; and
display any of said values on said remote unit at the test site,
wherein said testing device includes a current clamp connected to the remote unit and adapted to be placed around one of the electrodes and measure the current through the electrode, in order to enable calculation of a value for the resistance of said electrode.

20. The apparatus of claim 19 wherein said remote unit is adapted to communicate with said main unit by means of a wireless communication link.

21. The apparatus of claim 20 wherein the wireless communication link is an RF link selected from the group of ZigBee, Bluetooth or wireless LAN or mobile phone frequencies.

22. The apparatus of claim 20 wherein the wireless communication link is an infrared link.

23. The apparatus of claim 19 wherein at least one of said main unit and remote unit comprises distance measurement means preferably comprising at least one of a GPS receiver, a laser, an ultrasonic device, a mechanical device for obtaining distance information, wherein said distance information preferably includes at least one of geographical location and 3D coordinates of each measurement.

24. The apparatus of claim 19 wherein at least one of said main unit and remote unit comprises control operation means and is adapted to perform the step of calculation.

* * * * *

UNITED STATES PATENT AND TRADEMARK OFFICE
CERTIFICATE OF CORRECTION

| | | |
|---|---|---|
| PATENT NO. | : 8,390,299 B2 | Page 1 of 1 |
| APPLICATION NO. | : 12/625269 | |
| DATED | : March 5, 2013 | |
| INVENTOR(S) | : Laepple et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 91 days.

Signed and Sealed this
Second Day of December, 2014

Michelle K. Lee
*Deputy Director of the United States Patent and Trademark Office*